(12) United States Patent
Cheng et al.

(10) Patent No.: US 10,032,800 B2
(45) Date of Patent: Jul. 24, 2018

(54) ARRAY SUBSTRATE AND DISPLAY DEVICE (71) Applicant: BOE TECHNOLOGY GROUP CO., LTD., Beijing (CN)

(72) Inventors: Hongfei Cheng, Beijing (CN); Wenbo Li, Beijing (CN); Yong Qiao, Beijing (CN); Jianbo Xian, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 62 days.

(21) Appl. No.: 14/568,960

(22) Filed: Dec. 12, 2014

(65) Prior Publication Data

US 2015/0372016 A1 Dec. 24, 2015

(30) Foreign Application Priority Data

Jun. 18, 2014 (CN) ...................... 2014 2 0326083 U (51) Int. Cl.
*H01L 27/12* (2006.01)
(52) U.S. Cl.
CPC .................................. *H01L 27/124* (2013.01)
(58) Field of Classification Search
CPC .......................... H01L 27/124; H01L 27/1214
See application file for complete search history.

(56) References Cited

U.S. PATENT DOCUMENTS

| | | | |
|---|---|---|---|
| 7,557,886 B2* | 7/2009 | Lee ................... | G02F 1/134363 349/141 |
| 7,576,821 B2* | 8/2009 | Lee ................... | G02F 1/134363 349/141 |
| 2014/0049619 A1* | 2/2014 | Hsieh ................. | H04N 13/0413 348/51 |

* cited by examiner

*Primary Examiner* — Yu-Hsi D Sun
(74) *Attorney, Agent, or Firm* — Nath, Goldberg & Meyer; Joshua B. Goldberg; Stanley Protigal (57) ABSTRACT

The invention provides an array substrate and a display device. The array substrate comprises a plurality of gate lines and a plurality of data lines which are arranged crosswise and are insulated from each other, and a plurality of pixel units, wherein each pixel unit comprises a control section and a display section, each of which is symmetrically distributed with the central line of a corresponding gate line as a symmetry axis, the control section is located at a cross-point of the gate line and the data line, and is at least partially overlapped with the gate line and the data line, the display section is located at a region defined by the gate line and the data line; and the control section is connected to the display section to control the display section for display. In the present invention, the aperture ratio of the array substrate is increased.

16 Claims, 4 Drawing Sheets

ARRAY SUBSTRATE AND DISPLAY DEVICE

TECHNICAL FIELD

The invention relates to the field of display technology, and in particular to an array substrate and a display device.

BACKGROUND ART

Liquid Crystal Displays (LCDs) have become mainstream products in the present flat panel display devices due to their small volume, low power consumption, no radiation and so on. Liquid crystal display technology is widely applied to television, mobile phone and public information display.

A liquid crystal display panel is a main component of a liquid crystal display device, and the liquid crystal display panel comprises an array substrate and a color filter substrate. The array substrate comprises a plurality of gate lines and a plurality of data lines which are arranged crosswise and overlap with each other at cross-points, and pixel units are provided in regions enclosed by adjacent gate lines and data lines. The pixel unit comprises a thin film transistor and a pixel electrode, and the thin film transistor is used to control the pixel electrode for display.

Figure 1:
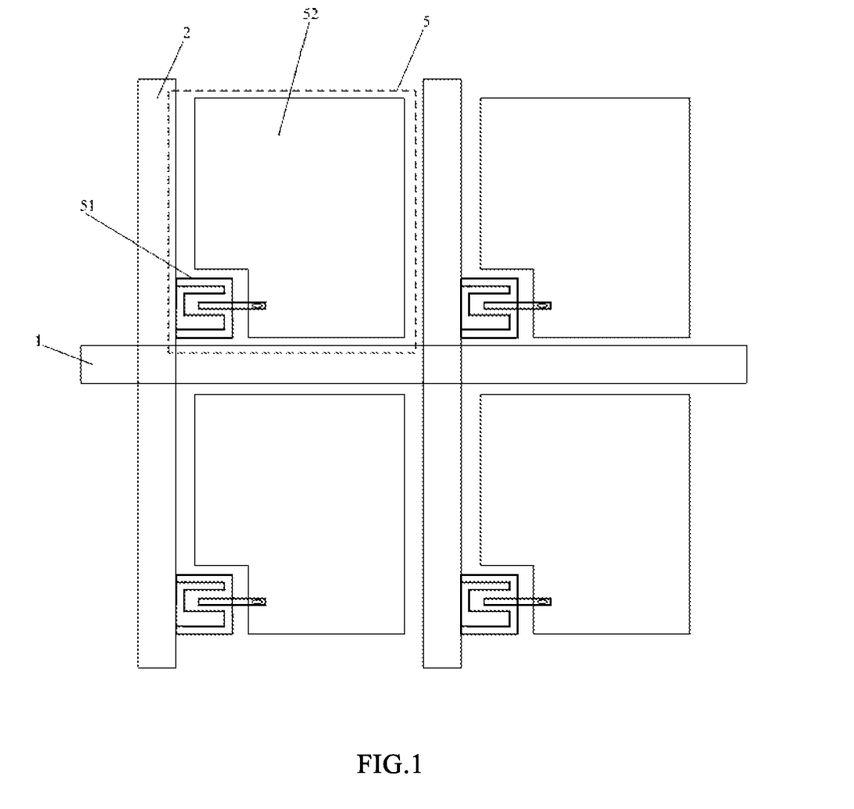
FIG. 1 is a top structural view of an array substrate in the prior art.

Generally, as shown in FIG. 1, in each of regions enclosed by data lines 2 and gate lines 1 which are arranged crosswise, there is provided a pixel unit 5, and pixel units 5 in the regions are arranged in a matrix. Each pixel unit 5 comprises a thin film transistor 51 and a pixel electrode 52, and the thin film transistor 51 is used to control the pixel electrode 52 for display.

In the array substrate with the above structure, the design of the pixel electrode is not flexible, and as the thin film transistor 51 occupies a relatively big space, thus the area of the pixel electrode 52 has to be small. Since an effective region for transmitting light and displaying is mainly formed by the region corresponding to the pixel electrode 52, therefore the aperture ratio (the ratio of the effective light-transmissive region to the area of the pixel unit) of the array substrate is relatively small, and thus the aperture ratio of the entire display panel is small, which results in the fact that the display performance of the display panel cannot be further improved.

SUMMARY

In view of above problems in the related art, an array substrate and a display device are provided. The array substrate may largely reduce the space occupied by the control section, so that the area of the display section may be increased accordingly, and thus the aperture ratio of the array substrate is increased and the display performance of the array substrate is improved.

The invention provides an array substrate comprising: a plurality of gate lines and a plurality of data lines which are arranged crosswise and are insulated from each other, and a plurality of pixel units, wherein each of the pixel units comprises a control section and a display section, each of which is symmetrically distributed with the central line of a corresponding gate line as a symmetry axis; the control section is located at a cross-point of the gate line and a corresponding data line, and is at least partially overlapped with the gate line and the data line, the display section is located at a region defined by gate line and the data line; and the control section is connected to the display section to control the display section for display.

Preferably, the control section comprises a first thin film transistor and a second thin film transistor, and the first thin film transistor and the second thin film transistor share a gate and an active region, and wherein the first thin film transistor comprises a first source, a second source and a first drain, the first source is electrically connected to the second source, the second thin film transistor comprises the second source, a third source and a second drain, the second source is electrically connected to the third source, and wherein the central line of the second source coincides with the central line of the gate line, the first source and the third source are symmetrical with respect to the central line of the second source, and the first drain and the second drain are symmetrical with respect to the central line of the second source, and the display section comprises a first pixel electrode and a second pixel electrode, the first pixel electrode and the second pixel electrode are symmetrical with respect to the central line of the gate line, the first pixel electrode is connected to the first drain, and the second pixel electrode is connected to the second drain.

Preferably, the gate is connected to the gate line, the gate extends in the same direction as that in which the data line extends, and the gate is at least partially overlapped with the data line; a width of the gate along a direction vertical to a direction, in which the gate line extends, is larger than that of the gate line, and the gate is symmetrically distributed with the central line of the gate line as a symmetry axis.

Preferably, a width of at least a part of the gate line corresponding to a region, where the first drain and the second drain are located, is smaller than that of other parts of the gate line so that a narrow section is formed, and wherein the narrow section is not overlapped with the first drain and the second drain.

Preferably, neither the first pixel electrode nor the second pixel electrode is overlapped with the gate line;

or the first pixel electrode and/or the second pixel electrode is partially overlapped with the gate line;

or the first pixel electrode and the second pixel electrode are connected as a whole and completely cover part of the gate line corresponding to the first pixel electrode and the second pixel electrode.

Preferably, the gate and the gate line are provided in the same layer, the active region is correspondingly provided above the gate, and a gate insulating layer is provided between the active region and the gate; the first source, the second source, the first drain, the third source and the second drain are provided in the same layer and are correspondingly provided above the active region, and the data line and the first source are provided in the same layer; and wherein the array substrate further comprises a passivation layer provided above the first thin film transistor and the second thin film transistor.

Preferably, the first pixel electrode and the second pixel electrode are provided in the same layer and above the passivation layer, a resin layer is further provided between the first and second pixel electrodes and the passivation layer, the passivation layer and the resin layer are provided with a first via at a region corresponding to a region where the first drain and the first pixel electrode overlap with each other, and are provided with a second via at a region corresponding to a region where the second drain and the second pixel electrode overlap with each other.

Preferably, the first pixel electrode and the second pixel electrode are provided in the same layer and above the gate insulating layer, a common electrode layer is provided above the passivation layer, wherein the common electrode layer is provided with first slits and second slits therein, the first slits are provided above the first pixel electrode, and the second slits are provided above the second pixel electrode.

Preferably, the length direction of the first slits and the length direction of the second slits are perpendicular to each other.

Preferably, length directions of corresponding first slits of any two adjacent first pixel electrodes are perpendicular to each other, and length directions of corresponding second slits of any two adjacent second pixel electrodes are perpendicular to each other.

The invention also provides a display device comprising the above array substrate.

Advantages of the invention are as follows: in the array substrate of the invention, both the control section and the display section in each pixel unit are provided to be symmetrically distributed with the central line of the gate line as a sharing symmetry axis, the control section is provided at a cross-point of the gate line and the data line, and the display section is provided at a region of the pixel unit other than the region where the control section is located, the gate lines are at least partially overlapped with the data lines, and the shared source is at least partially overlapped with the corresponding gate line, so that the space occupied by the control section is largely reduced and the area occupied by the display section may be increased accordingly, and thus the aperture ratio of the array substrate is increased and the display performance of the array substrate is improved.

In the display device of the invention, by adopting the above array substrate, the aperture ratio of the display device is largely increased and the display performance of the display device is improved.

DETAILED DESCRIPTION OF THE EMBODIMENTS

Reference Signs in the Drawings 1. gate line; 10. gate insulating layer; 11. passivation layer; 12. first via; 13. second via; 14. common electrode; 141. first slit; 142. second slit; 15. narrow section; 2. data line; 3. control section; 31. gate; 32. active region; 33. first source; 34. second source; 35. first drain; 36. third drain; 37. second drain; 4. display section; 41. first pixel electrode; 42. second pixel electrode; 5. pixel unit; 51. thin film transistor; 52. pixel electrode; 9. base.

In order to make a person skilled in the art understand the solutions of the invention better, the array substrate and the display device in the invention will be described in detail below in conjunction with the drawings and embodiments.

Embodiment 1

Figure 2:
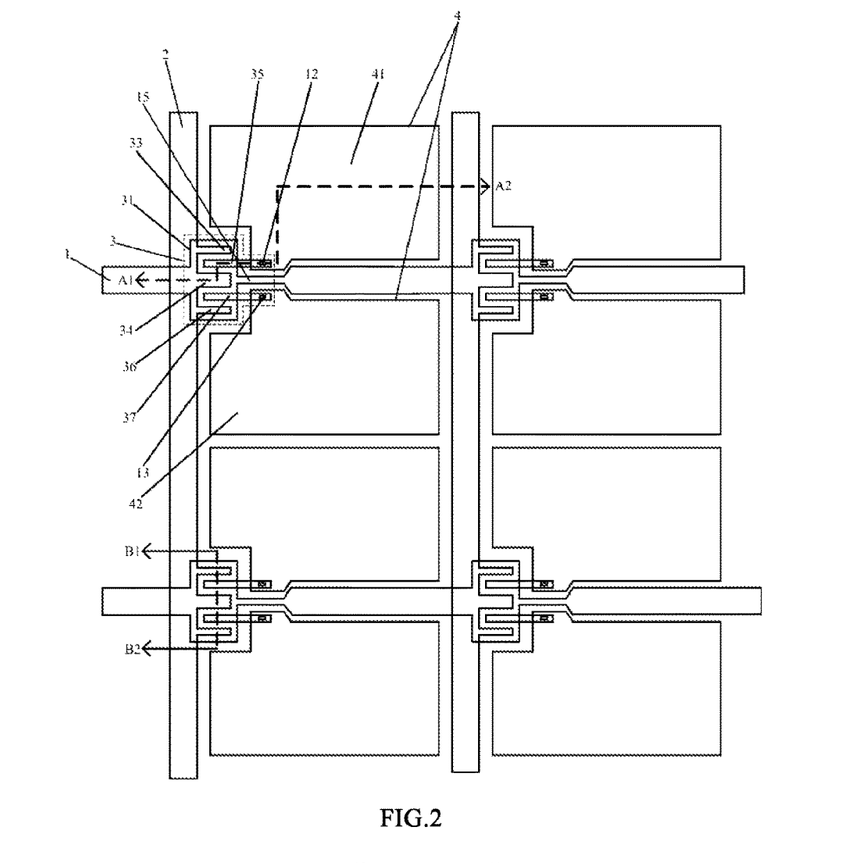
FIG. 2 is a top structural view of an array substrate in the embodiment 1 of the invention.

The embodiment provides an array substrate, which comprises, as shown in FIG. 2, a plurality of gate lines 1 and a plurality of data lines 2 which are arranged crosswise and are insulated from each other. The array substrate also comprises a plurality of pixel units which are provided at regions defined by the gate lines 1 and the data lines 2. The pixel unit comprises a control section 3 and a display section 4 each of which is symmetrically distributed with the central line of the corresponding gate line 1 as a symmetry axis, the control section 3 is provided at a cross-point of the gate line 1 and a corresponding data line 2, and the display section 4 is provided at a region of the pixel unit other than the region where the control section is located. The control section 3 is connected to the display section 4 so as to control the display section 4 for display.

Figure 3:
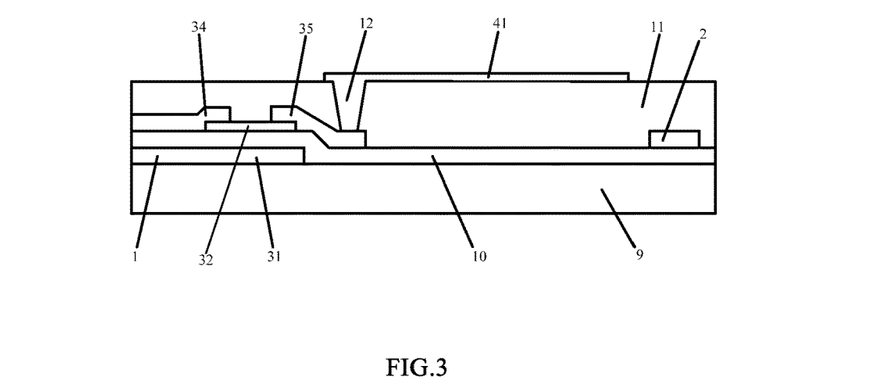
FIG. 3 is a partially sectional view of the array substrate in FIG. 2 taken along cut line A1A2.
Figure 4:
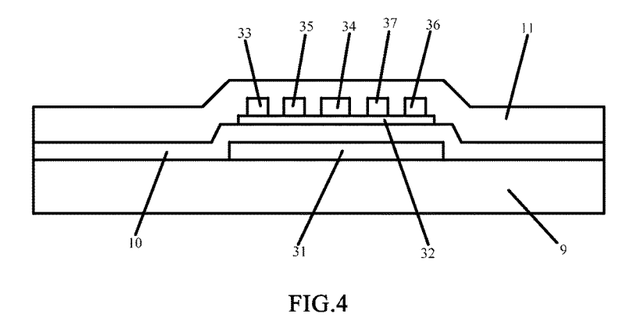
FIG. 4 is a partially sectional view of the array substrate in FIG. 2 taken along cut line B1B2.

As shown in FIG. 2, FIG. 3 and FIG. 4, the control section 3 comprises a first thin film transistor and a second thin film transistor, and the first thin film transistor and the second thin film transistor share a gate 31 and an active region 32. The first thin film transistor comprises a first source 33, a second source 34 and a first drain 35, and the first source 33 is electrically connected to the second source 34. The second thin film transistor shares the second source 34 of the first thin film transistor, the second thin film transistor also comprises a third source 36 and a second drain 37, and the second source 34 is electrically connected to the third source 36. The central line of the second source 34 coincides with the central line of the gate line 1, the first source 33 and the third source 36 are symmetrical with respect to the central line of the second source 34, and the first drain 35 and the second drain 37 are symmetrical with respect to the central line of the second source 34. That is, the second source 34 shared between the first thin film transistor and the second thin film transistor at least partially overlaps with the opaque gate line 1, so that the space occupied by the first thin film transistor and the second thin film transistor as a whole may be significantly reduced and thus the opaque overlapped region may be reduced as far as possible.

The display section 4 comprises a first pixel electrode 41 and a second pixel electrode 42, the first pixel electrode 41 and the second pixel electrode 42 are symmetrical with respect to the central line of the gate line 1, the first pixel electrode 41 is connected to the first drain 35, and the second pixel electrode 42 is connected to the second drain 37.

In the embodiment, the gate 31 is connected to the gate line 1, the gate 31 extends in the same direction as that in which the data line 2 extends, and the gate 31 at least partially overlaps with the data line 2; a width of the gate 31 along a direction vertical to the direction, in which the gate line 1 extends, is larger than the width of the gate line 1, and the gate 31 is symmetrically distributed with the central line of the gate line 1 as a symmetry axis. The gate 31 with such configuration can not only facilitate the sharing between the first thin film transistor and the second thin film transistor, but also largely reduce the total space occupied by the first thin film transistor and the second thin film transistor. In addition, as the gate 31 is partially overlapped with the data line 2, coupling capacitance between the gate 31 and the data line 2 will not be increased too much.

It can be seen that, in the embodiment, by making the opaque control section and the opaque data line/gate line at least partially overlap with each other, the space occupied by the first thin film transistor and the second thin film transistor in the array substrate is largely decreased, while the area occupied by the first pixel electrode 41 and the second pixel electrode 42 is accordingly increased, thus the aperture ratio of the array substrate is increased.

Accordingly, in a color filter substrate to be aligned with the array substrate, color filter layers of three primary colors of R, G and B may be directly provided at regions corresponding to the first pixel electrodes and the second pixel electrodes, and adjacent color filter layers are overlapped and joined together, so that light leakage can be prevented by thus configured color filter layers, therefore, black matrixes for blocking light disposed between the adjacent color filter layers (generally, between adjacent pixel units) in the prior art can be saved, and hence, the display region of the array substrate with a high aperture ratio in the embodiment can be fully used.

In the embodiment, the first pixel thin film transistor and the second thin film transistor are turned on or off simultaneously. For example, the first source 33, the second source 34 and the third source 36 are connected to the data line 2, the first source 33, the second source 34 and the first drain 35 enclose a first channel region being U-shaped. The second source 34, the third source 36 and the second drain 37 enclose a second channel region being U-shaped. With such configuration, the first thin film transistor and the second thin film transistor are formed to be identical in functions and can be on-off controlled simultaneously, and thus the first pixel electrode 41 and the second pixel electrode 42 can be controlled for display simultaneously and synchronously, the synchronous control and display performance of the pixel unit are improved, so that the control and display performance of the entire array substrate are further improved.

In the embodiment, a width of at least a part of the gate line 1 corresponding to a region where the first drain 35 and the second drain 37 are located is smaller than that of other parts of the gate line 1, that is, a part of the gate line 1 corresponding to a part of the first drain 35 and a part of the second drain 37 distributed outside the gate line 1 is provided as a narrow section 15, which is not overlapped with the first drain 35 and the second drain 37, so that the first drain 35 may be directly lapped and joined with the first pixel electrode 41, and the second drain 37 may be directly lapped and joined with the second pixel electrode 42. Thus, the coupling capacitance between the gate line 1 and the first and second drains 35, 37 may be reduced, adverse effect of the coupling capacitance on the on-off control performance of the first thin film transistor and the second thin film transistor can be avoided.

In the embodiment, both of the first pixel electrode 41 and the second pixel electrode 42 are not overlapped with the gate line 1.

In the embodiment, the gate 31 and the gate line 1 are provided in the same layer, the active region 32 is correspondingly provided above the gate 31, and a gate insulating layer 10 is provided between the active region 32 and the gate 31; the first source 33, the second source 34, the first drain 35, the third source 36 and the second drain 37 are provided in the same layer and are correspondingly provided above the active region 32, and the data line 2 and the first source 33 are provided in the same layer. The array substrate further comprises a passivation layer 11 provided above the first thin film transistor and the second thin film transistor.

The first pixel electrode 41 and the second pixel electrode 42 are provided in the same layer and above the passivation layer 11, a resin layer (not shown in FIGS. 2-4) is further provided between the passivation layer 11 and the first and second pixel electrodes 41, 42, the passivation layer 11 and the resin layer are provided with a first via 12 at a region corresponding to a region where the first drain 35 and the first pixel electrode 41 overlap with each other, and are provided with a second via 13 at a region corresponding to a region where the second drain 37 and the second pixel electrode 42 overlap with each other.

Adding a resin layer above the passivation layer 11 can further decrease the coupling capacitance between the first thin film transistor and the first pixel electrode 41 and the coupling capacitance between the second thin film transistor and the second pixel electrode 42, thus adverse effect of the coupling capacitance on the performance of the array substrate can be decreased.

In the embodiment, the gate line 1 and the data line 2 may be formed of metal, such as any one of Cu, Al, Mo, Ti, Cr, and W or alloy thereof. The gate line 1 may be of a single-layered or multi-layered structure, for example, as for the gate line 1 of a three-layered structure, the layers may be formed of Mo/Al/Mo or Ti/Cu/Ti respectively, and as for the gate line 1 of a two-layered structure, the layers may be formed of MoTi/Cu respectively. The gate line 1 of a multi-layered structure may, on one hand, increase the adhesiveness between the gate line 1 and the base 9, and on the other hand, for example, as for the gate line 1 of a three-layered structure formed of Mo/Al/Mo, Mo in the outer layer may protect Al in the inner layer from being oxidized.

The gate insulating layer 10 is made of silicon oxide or silicon nitride, and may be of a single-layered or multi-layered structure, for example, for a gate insulating layer 10 of a two-layered structure, the layers may be formed of silicon oxide/silicon nitride. The gate insulating layer 10 of a multi-layered structure may enhance its insulating property.

The active region 32 may be formed of amorphous silicon, polycrystalline silicon, microcrystalline silicon or oxide semiconductor material. The passivation layer 11 may be formed of inorganic material such as silicon nitride, and the resin layer may be formed of organ material. The first pixel electrode 41 and the second pixel electrode 42 may be formed by using ITO, IZO or other transparent metal oxide conductive material.

The manufacturing method of the array substrate in the embodiment comprises following steps:

Step 1: sputtering and depositing a metal layer (such as Al) on the base 9, then coating photoresist, and performing exposure, development and etching processes to form a pattern including the gate line 1 and the gate 31.

Step 2: on the base 9 subjected to Step 1, forming the gate insulating layer 10 (such as silicon nitride) by using PECVD (chemical vapor deposition) method.

Step 3: on the base 9 subjected to Step 2, depositing a semiconductor layer, such as sequentially depositing a-Si and n+a-Si by using PECVD method, or sputtering and depositing IGZO (indium gallium zinc oxide); then coating photoresist, and performing exposure, development and etching processes to form a pattern including the active region 32.

Step 4: on the base 9 subjected to Step 3, sputtering and depositing a metal layer (such as Al), then coating photoresist, and performing exposure, development and etching processes to form a pattern including the data line 2, the first source 33, the second source 34, the first drain 35, the third source 36 and the second drain 37.

Step 5: on the base 9 subjected to Step 4, sequentially depositing silicon nitride to form the passivation layer film and coating the resin layer film, then coating photoresist, and performing exposure, development and etching processes to form a pattern including the first via 12, the second via 13, the passivation layer 11 and the resin layer. The first via 12 exposes the first drain 35, and the second via exposes the second drain 37.

Step 6: on the base 9 subjected to Step 5, sputtering a transparent metal oxide conductive material layer, such as ITO, then coating photoresist, and performing exposure, development and etching processes to form a pattern including the first pixel electrode 41 and the second pixel electrode 42.

The array substrate in the embodiment is applicable to a liquid crystal display panel of TN (Twisted Nematic) mode and a liquid crystal display panel of VA (Vertical Alignment) mode.

In addition, it should be understood by persons skilled in the art that, coating photoresist, and subsequent exposure, development and etching processes may be collectively referred to as the patterning process.

Embodiment 2

Unlike the embodiment 1, in an array substrate in the present embodiment, both of the first pixel electrode and the second pixel electrode are partially overlapped with the gate line; alternatively, the first pixel electrode and the second pixel electrode are connected as a whole, and completely cover part of the gate line corresponding to the first pixel electrode and the second pixel electrode.

With such configuration, areas of the first pixel electrode and the second pixel electrode may be further increased, and thus the aperture ratio of the array substrate may be further increased.

Other structures, manufacturing method and materials of the array substrate in the present embodiment are the same as those in the embodiment 1, and will not be described herein.

Embodiment 3

Figure 5:
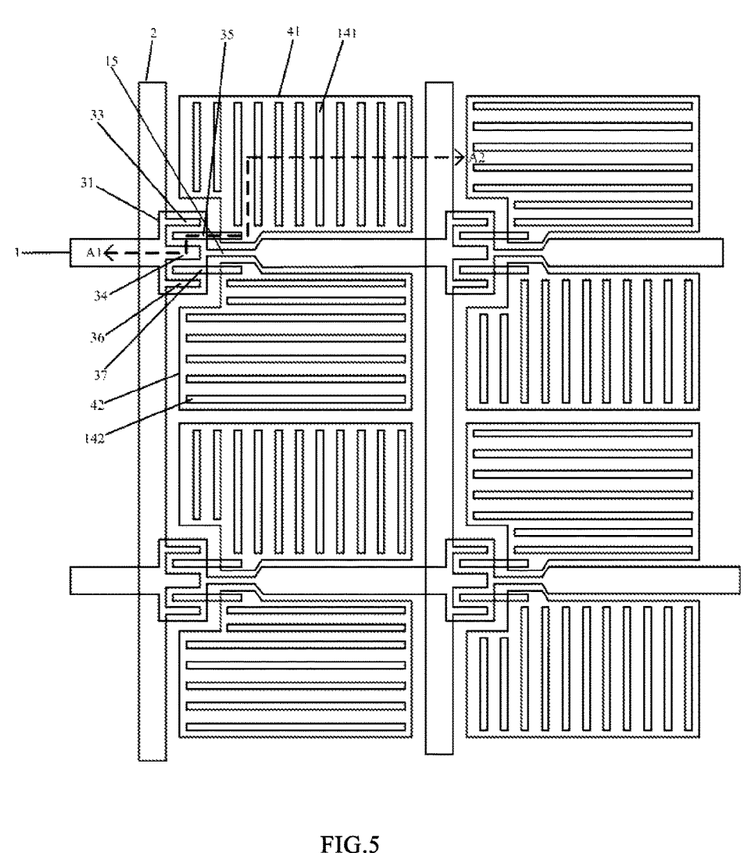
FIG. 5 is a top structural view of an array substrate in the embodiment 3 of the invention.
Figure 6:
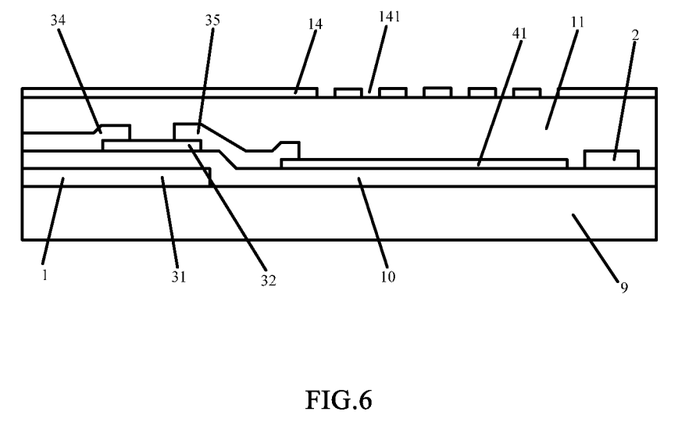
FIG. 6 is a partially sectional view of the array substrate in FIG. 5 taken along cut line A1A2.

The present embodiment provides an array substrate, unlike the embodiments 1 and 2, as shown in FIG. 5 and FIG. 6, the first pixel electrode 41 and the second pixel electrode 42 are provided in the same layer and above the gate insulating layer 10, and a common electrode layer 14 is provided above the passivation layer 11, wherein the common electrode layer 14 is provided with first slits 141 and second slits 142 therein, the first slits 141 are correspondingly provided above the first pixel electrode 41, and the second slits 142 are correspondingly provided above the second pixel electrode 42.

As the first pixel electrode 41 and the second pixel electrode 42 above the gate insulating layer 10 may directly contact the first drain 35 and the second drain 37 and connected thereto, respectively, in the present embodiment, it is unnecessary to provide the first via and the second via in the passivation layer 11 and the resin layer.

With above configuration, the first pixel electrode 41, the second pixel electrode 42 and the data line 2 are provided in the same layer, as an electric field may be also generated at a corresponding region between the data line 2 and the common electrode layer 14, light transmitted from the corresponding region between the data line 2 and the common electrode layer 14 may be used to display, thus the aperture ratio of the array substrate may be further increased. That is to say, the array substrate in the present embodiment is particularly suitable to a liquid crystal display panel of HADS (High Aperture Ratio Advanced Super Dimension Switch) mode.

In the present embodiment, the length direction of the first slits 141 and the length direction of the second slits 142 are perpendicular to each other. With such configuration, the direction of the horizontal electric field generated between the first pixel electrode 41 and the common electrode layer 14 is different from that of the horizontal electric field generated between the second pixel electrode 42 and the common electrode layer 14, that is, in one pixel unit, two-domain liquid crystal arrangement may be obtained, which may enlarge the view angle of the liquid crystal display.

In the present embodiment, length directions of corresponding first slits 141 of any two adjacent first pixel electrodes 41 are perpendicular to each other, and length directions of corresponding second slits 142 of any two adjacent second pixel electrodes 42 are perpendicular to each other. With such configuration, horizontal electric fields generated between any two adjacent pixel electrodes and the common electrode layer 14 on the array substrate are different in direction, which may enlarge the view angle of the liquid crystal display.

The manufacturing method of the array substrate in the embodiment comprises following steps:

Step 1: sputtering and depositing a metal layer (such as Al) on the base 9, then coating photoresist, and performing exposure, development and etching processes to form a pattern including the gate line 1 and the gate 31.

Step 2: on the base 9 subjected to Step 1, depositing silicon nitride by using PECVD (chemical vapor deposition) method to form the gate insulating layer 10.

Step 3: on the base 9 subjected to Step 2, depositing a semiconductor layer, such as sequentially depositing a-Si and n+a-Si by using PECVD method, or sputtering and depositing IGZO (indium gallium zinc oxide); then coating photoresist, and performing exposure, development and etching processes to form a pattern including the active region 32.

Step 4: on the base 9 subjected to Step 3, sputtering a transparent metal oxide conductive material layer, such as ITO, then coating photoresist, and performing exposure, development and etching processes to form a pattern including the first pixel electrode 41 and the second pixel electrode 42.

Step 5: on the base 9 subjected to Step 4, sputtering and depositing a metal layer (such as Al), then coating photoresist, and performing exposure, development and etching processes to form a pattern including the data line 2, the first source 33, the second source 34, the first drain 35, the third source 36 and the second drain 37.

Step 6: on the base 9 subjected to Step 5, sequentially depositing silicon nitride to form the passivation layer 11 and coating the resin layer.

Step 7: on the base 9 subjected to Step 6, sputtering a transparent metal oxide conductive material layer, such as ITO, then coating photoresist, and performing exposure, development and etching processes to form a pattern including the common electrode layer 14, the first slits 141 and the second slits 142.

Other structures, manufacturing method and materials of the array substrate in the present embodiment are the same as those in any one of the embodiments 1 and 2, and will not be described herein.

Advantages of the embodiments 1-3 are as follows: in the array substrate of the embodiments 1-3, each of the control section and the display section in each pixel unit is provided to be symmetrically distributed with the central line of the corresponding gate line as a symmetry axis, the control section is provided at a cross-point of the gate line and the data line, and the display section is provided at a region of the pixel unit other than the region where the control section is located, the gate lines are at least partially overlapped with the data lines, and the shared source is at least partially overlapped with the corresponding gate line, so that the space occupied by the control section is largely reduced and the area occupied by the display section may be increased accordingly, and thus the aperture ratio of the array substrate is increased and the display performance of the array substrate is improved.

Embodiment 4

The present embodiment provides a display device comprising the array substrate in any one of the embodiments 1-3.

The display device may be a liquid crystal panel, electronic paper, a phone, a Tablet PC, a television, a display, a notebook PC, a digital photo frame, a navigator, and any other product or member with display function.

With the array substrate in any one of the embodiments 1-3, the aperture ratio of the display device is largely increased and the display performance of the display device is improved.

It should be understood that the embodiments above are just exemplary embodiments of the present invention to describe the principle of the present invention, and the present invention is not limited thereto. Any person skilled in the art can make various changes and substitutions without departing from the spirit and substance of the present invention, which should be considered to be within the protection scope of the present invention.

The invention claimed is:

1. An array substrate comprising: a plurality of gate lines and a plurality of data lines which are arranged crosswise and are insulated from each other, and a plurality of pixel units,
   wherein each of the pixel units comprises a control section and a display section, each of the control section and the display section are symmetrically distributed with the central line of a corresponding gate line as a symmetry axis,
   wherein the control section is located at a cross-point of the gate line and a corresponding data line, and is at least partially overlapped with the gate line and the data line, and the display section is located at a region defined by the gate line and the data line, wherein the control section is connected to the display section to control the display section for display,
   wherein the control section comprises a first thin film transistor and a second thin film transistor, and the first thin film transistor and the second thin film transistor share a gate and an active region,
   wherein the gate is connected to the gate line, the gate extends in the same direction as that in which the data line extends, and the gate is at least partially overlapped with the data line; a width of the gate along a direction vertical to the direction, in which the gate line extends, is larger than that of the gate line, and the gate is symmetrically distributed with the central line of the gate line as a symmetry axis,
   wherein the first thin film transistor further comprises a first source, a second source and a first drain, the first source is electrically connected to the second source,
   wherein the second thin film transistor further comprises the second source, a third source and a second drain, the second source is electrically connected to the third source,
   wherein the central line of the second source coincides with the central line of the gate line, the first source and the third source are symmetrical with respect to the central line of the second source, and the first drain and the second drain are symmetrical with respect to the central line of the second source,
   wherein the display section comprises a first pixel electrode and a second pixel electrode, the first pixel electrode and the second pixel electrode are symmetrical with respect to the central line of the gate line, the first pixel electrode is connected to the first drain, and the second pixel electrode is connected to the second drain,
   and wherein the first source, the second source and the third source are connected to the data line respectively and longer sides of the first source, the second source and the third source are parallel to the gate line in an extension direction of the gate line in a plane of the array substrate, the first drain is provided between the first source and the second source, the second drain is provided between the second source and the third source, and longer sides of the first drain and the second drain are parallel to the gate line in an extension direction of the gate line in a plane of the array substrate,
   and wherein the longer sides of the first source, the second source and the third source are perpendicular to the data line, and the first source, the second source and the third source are sequentially arranged in an extension direction of the data line in the plane of the array substrate.

2. The array substrate of claim 1, wherein a width of at least a part of the gate line corresponding to a region, where the first drain and the second drain are located, is smaller than that of other parts of the gate line so that a narrow section is formed, and wherein the narrow section is not overlapped with the first drain and the second drain.

3. The array substrate of claim 2, wherein neither the first pixel electrode nor the second pixel electrode is overlapped with the gate line;
   or the first pixel electrode and/or the second pixel electrode is partially overlapped with the gate line;
   or the first pixel electrode and the second electrode are connected as a whole, and completely cover part of the gate line corresponding to the first pixel electrode and the second pixel electrode.

4. The array substrate of claim 3, wherein the gate and the gate line are provided in the same layer, the active region is correspondingly provided above the gate, and a gate insulating layer is provided between the active region and the gate; the first source, the second source, the first drain, the third source and the second drain are provided in the same layer and are correspondingly provided above the active region, and the data line and the first source are provided in the same layer,
   and wherein the array substrate further comprises a passivation layer provided above the first thin film transistor and the second thin film transistor.

5. The array substrate of claim 4, wherein the first pixel electrode and the second pixel electrode are provided in the same layer and above the passivation layer, a resin layer is further provided between the first and second pixel electrodes and the passivation layer, the passivation layer and the resin layer are provided with a first via at a region corresponding to a region where the first drain and the first pixel electrode overlap with each other, and are provided with a second via at a region corresponding to a region where the second drain and the second pixel electrode overlap with each other.

6. The array substrate of claim 4, wherein the first pixel electrode and the second pixel electrode are provided in the same layer and above the gate insulating layer, a common electrode layer is provided above the passivation layer, wherein the common electrode layer is provided with first slits and second slits therein, the first slits are correspondingly provided above the first pixel electrode, and the second slits are correspondingly provided above the second pixel electrode.

7. The array substrate of claim 6, wherein the lengthwise direction of the first slits and the lengthwise direction of the second slits are perpendicular to each other.

8. The array substrate of claim 7, wherein lengthwise directions of corresponding first slits of any two adjacent first pixel electrodes are perpendicular to each other, and lengthwise directions of corresponding second slits of any two adjacent second pixel electrodes are perpendicular to each other.

9. A display device comprising an array substrate, which comprises a plurality of gate lines and a plurality of data lines which are arranged crosswise and are insulated from each other, and a plurality of pixel units,
wherein each of the pixel units comprises a control section and a display section, each of the control section and the display section are symmetrically distributed with the central line of a corresponding gate line as a symmetry axis,
wherein the control section is located at a cross-point of the gate line and a corresponding data line, and is at least partially overlapped with the gate line and the data line, and the display section is located at a region defined by the gate line and the data line,
wherein the control section is connected to the display section to control the display section for display,
wherein the control section comprises a first thin film transistor and a second thin film transistor, and the first thin film transistor and the second thin film transistor share a gate and an active region,
wherein the gate is connected to the gate line, the gate extends in the same direction as that in which the data line extends, and the gate is at least partially overlapped with the data line; a width of the gate along a direction vertical to the direction, in which the gate line extends, is larger than that of the gate line, and the gate is symmetrically distributed with the central line of the gate line as a symmetry axis,
wherein the first thin film transistor further comprises a first source, a second source and a first drain, the first source is electrically connected to the second source,
wherein the second thin film transistor further comprises the second source, a third source and a second drain, the second source is electrically connected to the third source,
wherein the central line of the second source coincides with the central line of the gate line, the first source and the third source are symmetrical with respect to the central line of the second source, and the first drain and the second drain are symmetrical with respect to the central line of the second source,
wherein the display section comprises a first pixel electrode and a second pixel electrode, the first pixel electrode and the second pixel electrode are symmetrical with respect to the central line of the gate line, the first pixel electrode is connected to the first drain, and the second pixel electrode is connected to the second drain,
and wherein the first source, the second source and the third source are connected to the data line respectively and longer sides of the first source, the second source and the third source are parallel to the gate line in an extension direction of the gate line in a plane of the array substrate, the first drain is provided between the first source and the second source, the second drain is provided between the second source and the third source, and longer sides of the first drain and the second drain are parallel to the gate line in an extension direction of the gate line in a plane of the array substrate,
and wherein the longer sides of the first source, the second source and the third source are perpendicular to the data line, and the first source, the second source and the third source are sequentially arranged in an extension direction of the data line in the plane of the array substrate.

10. The display device of claim 9, wherein a width of at least a part of the gate line corresponding to a region, where the first drain and the second drain are located, is smaller than that of other parts of the gate line so that a narrow section is formed, and wherein the narrow section is not overlapped with the first drain and the second drain.

11. The display device of claim 10, wherein neither the first pixel electrode nor the second electrode is overlapped with the gate line;
or the first pixel electrode and/or the second pixel electrode is partially overlapped with the gate line;
or the first pixel electrode and the second electrode are connected as a whole and completely cover part of the gate line corresponding to the first pixel electrode and the second pixel electrode.

12. The display device of claim 11, wherein the gate and the gate line are provided in the same layer, the active region is correspondingly provided above the gate, and a gate insulating layer is provided between the active region and the gate; the first source, the second source, the first drain, the third source and the second drain are provided in the same layer and are correspondingly provided above the active region, and the data line and the first source are provided in the same layer;
and wherein the array substrate further comprises a passivation layer provided above the first thin film transistor and the second thin film transistor.

13. The display device of claim 12, wherein the first pixel electrode and the second pixel electrode are provided in the same layer and above the passivation layer, a resin layer is further provided between the first and second pixel electrodes and the passivation layer, the passivation layer and the resin layer are provided with a first via at a region corresponding to a region where the first drain and the first pixel electrode overlap with each other, and are provided with a second via at a region corresponding to a region where the second drain and the second pixel electrode overlap with each other.

14. The display device of claim 12, wherein the first pixel electrode and the second pixel electrode are provided in the same layer and above the gate insulating layer, a common electrode layer is provided above the passivation layer, wherein the common electrode layer is provided with first slits and second slits therein, the first slits are correspondingly provided above the first pixel electrode, and the second slits are correspondingly provided above the second pixel electrode.

15. The display device of claim 14, wherein the lengthwise direction of the first slits and the lengthwise direction of the second slits are perpendicular to each other.

16. The display device of claim 15, wherein lengthwise directions of corresponding first slits of any two adjacent first pixel electrodes are perpendicular to each other, and lengthwise directions of corresponding second slits of any two adjacent second pixel electrodes are perpendicular to each other.

* * * * *